(12) United States Patent
Nakamura

(10) Patent No.: US 9,969,007 B2
(45) Date of Patent: May 15, 2018

(54) COATED CUTTING TOOL

(71) Applicant: TUNGALOY CORPORATION, Iwaki-shi, Fukushima (JP)

(72) Inventor: Takaaki Nakamura, Iwaki (JP)

(73) Assignee: TUNGALOY CORPORATION, Iwaki-shi, Fukushima (JP)

( * ) Notice: Subject to any disclaimer, the term of this patent is extended or adjusted under 35 U.S.C. 154(b) by 175 days.

(21) Appl. No.: 15/112,713

(22) PCT Filed: Jan. 27, 2015

(86) PCT No.: PCT/JP2015/052170
§ 371 (c)(1),
(2) Date: Jul. 20, 2016

(87) PCT Pub. No.: WO2015/111752
PCT Pub. Date: Jul. 30, 2015

(65) Prior Publication Data
US 2016/0332237 A1    Nov. 17, 2016

(30) Foreign Application Priority Data

Jan. 27, 2014  (JP) ................................. 2014-012440

(51) Int. Cl.
*B23B 27/14*   (2006.01)
*C23C 16/40*   (2006.01)
(Continued)

(52) U.S. Cl.
CPC .......... *B23B 27/148* (2013.01); *C23C 16/32* (2013.01); *C23C 16/34* (2013.01); *C23C 16/36* (2013.01);
(Continued)

(58) Field of Classification Search
USPC .......... 51/307, 309; 428/216, 336, 698, 701, 428/702; 407/119; 451/540
See application file for complete search history.

(56) References Cited

U.S. PATENT DOCUMENTS 5,587,233 A    12/1996  König et al.
6,333,103 B1   12/2001  Ishii et al.
(Continued)

FOREIGN PATENT DOCUMENTS

| JP | 2004-299021 | 10/2004 |
|----|-------------|---------|
| JP | 2013-111722 | 6/2013  |
| JP | 2013-139064 | 7/2013  |

OTHER PUBLICATIONS

Hochauer et al "Carbon doped alpha Al2O3 coatings grown by chemical vapor deposition" Surface & Coatings Tech 206 (2012) p. 4771-4777.*

(Continued)

*Primary Examiner* — Archene Turner
(74) *Attorney, Agent, or Firm* — Studebaker & Brackett PC

(57) ABSTRACT

A coated cutting tool includes a substrate and a coating having at least one α-type aluminum oxide layer. In a cross-section of the α-type aluminum oxide layer, when an angle formed by a normal to the cross-sectional surface and a normal to a (222) plane of a particle of the α-type aluminum oxide layer is regarded as a misorientation, and when areas of particles, each of which has a misorientation ranging from 0-90 degrees, of the α-type aluminum oxide layer are defined as constituting 100 area %, and the areas of particles, each of which has a misorientation ranging from 0-90 degrees, of the α-type aluminum oxide layer are divided into respective 10-degree pitches, a total Sa of the areas of particles having a misorientation ranging from (Continued)

20-30 degrees, of the α-type aluminum oxide layer is at a maximum from among totals of areas for nine divisions in respective 10-degree pitches.

20 Claims, 2 Drawing Sheets

(51) Int. Cl.
C23C 16/32 (2006.01)
C23C 16/34 (2006.01)
C23C 16/36 (2006.01)

(52) U.S. Cl.
CPC ........ *C23C 16/403* (2013.01); *B23B 2222/16* (2013.01); *B23B 2222/28* (2013.01); *B23B 2226/125* (2013.01); *B23B 2226/18* (2013.01); *B23B 2228/04* (2013.01); *B23B 2228/105* (2013.01)

(56) References Cited

U.S. PATENT DOCUMENTS

| | | | | |
|---|---|---|---|---|
| 7,442,433 | B2* | 10/2008 | Honma | C23C 16/30 428/701 |
| 2007/0116985 | A1* | 5/2007 | Osada | C23C 16/403 428/698 |
| 2008/0187775 | A1 | 8/2008 | Ruppi et al. | |
| 2009/0170415 | A1* | 7/2009 | Tomita | C23C 16/0272 451/540 |
| 2010/0330360 | A1* | 12/2010 | Tanibuchi | C23C 16/0272 428/332 |
| 2011/0247465 | A1 | 10/2011 | Lind et al. | |
| 2012/0225247 | A1 | 9/2012 | Sone | |
| 2014/0193622 | A1* | 7/2014 | Stiens | C23C 16/403 428/216 |

OTHER PUBLICATIONS

International Search Report dated Apr. 21, 2015 issued in counterpart International (PCT) Application (No. PCT/JP2015/052170).
Written Opinion dated Apr. 21, 2015 issued in counterpart International (PCT) Application (No. PCT/JP2015/052170).

* cited by examiner

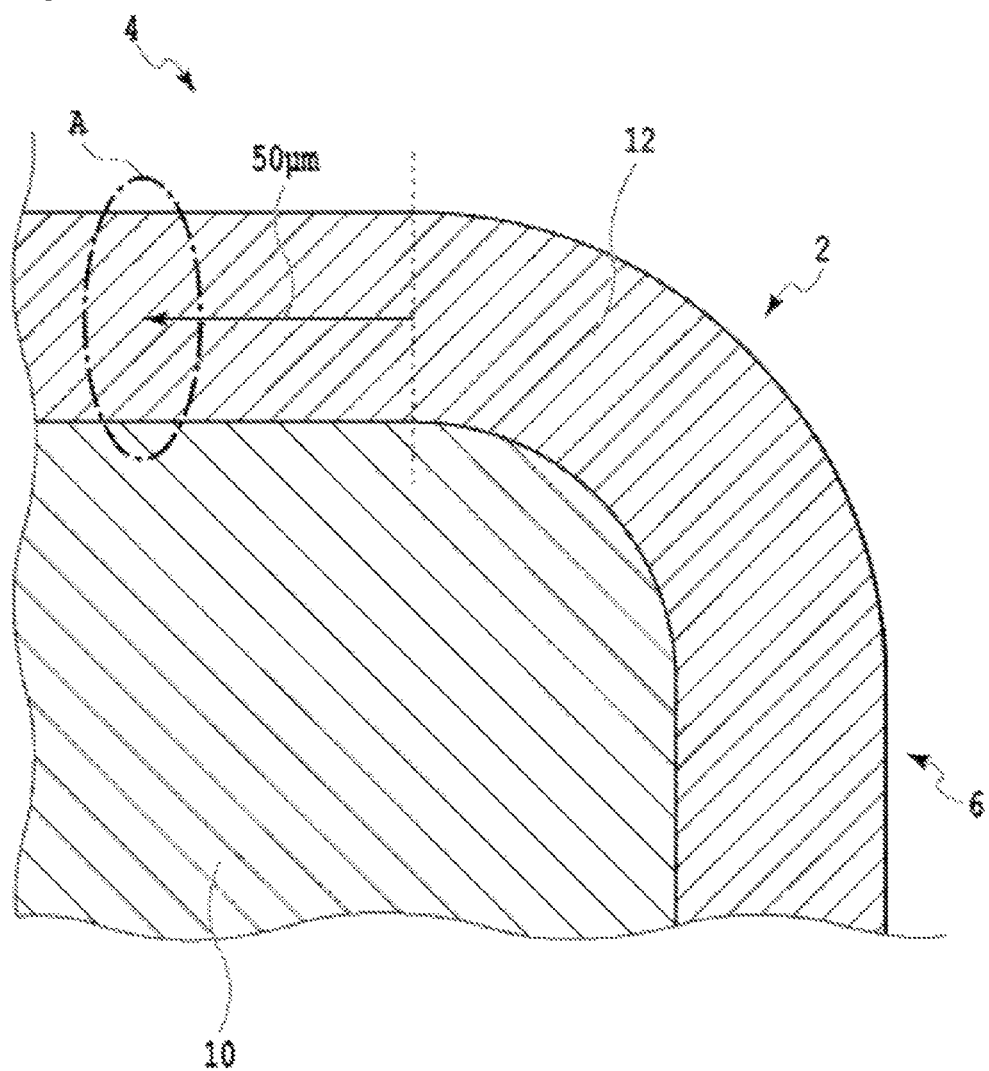

[FIG. 2]
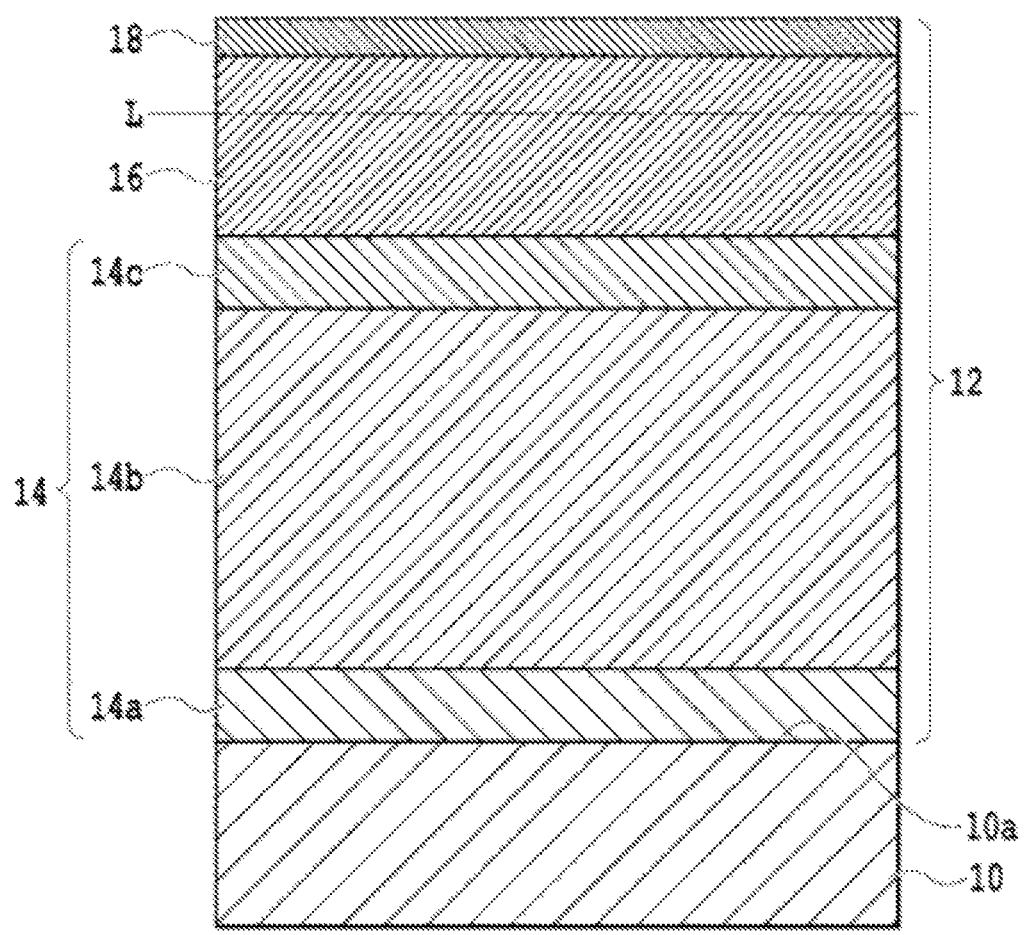

COATED CUTTING TOOL

RELATED APPLICATIONS

This is a 371 US National Phase of International Patent Application No. PCT/JP2015/052170 filed Jan. 27, 2015 and published as WO 2015/111752A1 on Jul. 30, 2015, which claims priority to JP 2014-012440, filed Jan. 27, 2014. The contents of the aforementioned applications are incorporated by reference in their entirety.

TECHNICAL FIELD

The present invention relates to a coated cutting tool.

BACKGROUND ART

Conventionally, a coated cutting tool formed by depositing, through chemical vapor deposition, a coating layer onto a surface of a substrate comprised of, for example, a cemented carbide, is well known for being used for the cutting of steel, cast iron, etc. A coating layer generally consists of a single layer of one kind selected from among, for example, Ti-based compounds (carbides, nitrides, carbonitrides, carbonates and carboxynitrides) and aluminum oxide, or consists of multiple layers of two or more kinds selected therefrom, and such coating layer has a total thickness of 3 to 20 μm.

Patent Document 1 discloses a cutting tool in which, on a surface of a tool substrate made of a WC group cemented carbide or TiCN group cermet, a Ti compound layer is formed as a lower layer and an $Al_2O_3$ layer is provided as an upper layer. Patent Document 1 indicates that such $Al_2O_3$ layer has a κ type or θ type crystal structure in the state of having been formed through chemical vapor deposition and has been subjected to modification treatment so as to have, through heat treatment after chemical vapor deposition, an α-type crystal structure, and also indicates that such $Al_2O_3$ layer shows an X-ray diffraction chart which shows clear diffraction peaks on a (006) plane and a (018) plane in an X-ray diffraction measurement.

CITATION LIST

Patent Document

Patent Document 1: JP2004-299021 A

SUMMARY

Technical Problem

An increase in speed, feed and depth of cut have become conspicuous in cutting in recent times, leading to a tendency that the tool life has become shorter than that involved in the prior art. Such background has been increasing demand for a further enhancement of wear resistance and fracture resistance (including chipping resistance) of a tool.

Under such situation, with regard to the tool of Patent Document 1 above, the present inventor conducted experiments, and the results have confirmed that, during cutting, wear easily progresses in the tool of Patent Document 1 because of scraped off particles of an α-type aluminum oxide layer, leading to the problem of wear resistance.

An object of the present invention is to provide a coated cutting tool having excellent wear resistance and fracture resistance.

Solution to Problem

The present inventor has exerted originality and ingenuity, focusing on crystal orientations and thereby optimized the crystal orientations and has then found that a balance is achieved between wear resistance and fracture resistance in a coated cutting tool. Namely, the present inventor has conducted studies, from the same perspective as that set forth above, regarding the extension of tool life of the coated cutting tool and has then gained findings that a cutting tool having the following configuration focusing on crystal orientations, in particular, slip systems, enables wear resistance to be enhanced with no loss of fracture resistance, as a result of which the life of such tool can be extended.

An aspect of the present invention provides a coated cutting tool comprising: a substrate; and a coating layer formed on a surface of the substrate, wherein: the coating layer comprises at least one α-type aluminum oxide layer; and in a cross-sectional surface of the α-type aluminum oxide layer which is substantially parallel to the surface of the substrate, when an angle formed by a normal to the cross-sectional surface and a normal to a (222) plane of a particle of the α-type aluminum oxide layer is regarded as a misorientation, and when areas of particles, each of which has a misorientation ranging from 0 degrees or more to 90 degrees or less, of the α-type aluminum oxide layer are defined as constituting 100 area %, and the areas of particles, each of which has a misorientation ranging from 0 degrees or more to 90 degrees or less, of the α-type aluminum oxide layer are divided into respective 10-degree pitches, a total Sa of the areas of particles, each of which has a misorientation ranging from 20 degrees or more to below 30 degrees, of the α-type aluminum oxide layer in the cross-sectional surface is at a maximum from among totals of areas for nine divisions in respective 10-degree pitches.

According to an aspect of the present invention having the above configuration, a total Sa of the areas of particles, each of which has a misorientation ranging from 20 degrees or more to below 30 degrees, of the α-type aluminum oxide layer is at a maximum from among totals of areas for nine divisions in respective 10-degree pitches. Therefore, particles each of which has a misorientation ranging from 20 degrees or more to below 30 degrees are dominant in the α-type aluminum oxide layer, and high wear resistance can be achieved with no reduction in fracture resistance of the cutting tool.

The total Sa of the areas of particles, each of which has a misorientation ranging from 20 degrees or more to below 30 degrees, of the α-type aluminum oxide layer, preferably has a range of 25 area %≤Sa≤70 area %.

A total Sb of the areas of particles, each of which has a misorientation ranging from 0 degrees or more to below 10 degrees, of the α-type aluminum oxide layer, preferably has a range of 10 area %≤Sb≤20 area %.

An average thickness of the α-type aluminum oxide layer is preferably from 1 μm or more to 15 μm or less.

The coating layer preferably comprises, between the substrate and the α-type aluminum oxide layer, a Ti compound layer of a Ti compound formed of a Ti element and at least one element selected from the group consisting of C, N, O and B.

An average thickness of the coating layer is preferably from 3 μm or more to 30 μm or less, and an average thickness of the Ti compound layer is preferably from 2 μm or more to 15 μm or less.

The cross-sectional surface of the α-type aluminum oxide layer may be defined with regard to a predetermined region of a rake surface or a flank of the coated cutting tool. The cross-sectional surface may be defined in a position where at least 50% of the α-type aluminum oxide layer is left in a thickness direction of the coating layer. The cross-sectional surface of the α-type aluminum oxide layer is preferably a polished surface.

The substrate may comprise any one of a cemented carbide, cermet, ceramic and a sintered body of cubic boron nitride.

The above-described coated cutting tool may be a cutting insert capable of being removably attached to a tool body.

BRIEF DESCRIPTION OF DRAWINGS

FIG. 1 is a schematic cross-sectional view showing a part near an edge of a coated cutting tool according to an embodiment of the present invention.

FIG. 2 is a schematic view showing a configuration of a coating layer in an invention of a coated cutting tool manufactured according to the present invention.

DESCRIPTION OF EMBODIMENTS

<Coated Cutting Tool>

The present invention is directed at a coated cutting tool. A coated cutting tool includes a substrate and a coating layer formed on a surface of the substrate. The coated cutting tool may be constituted by a substrate and a coating layer. The coated cutting tool includes a cutting edge at an intersection of a rake surface and a flank. The coating layer is, at a minimum, formed in a predetermined region including the cutting edge and is preferably formed so as to extend from the rake surface to the flank, and the coating layer may be formed over a part of a surface of the substrate and may alternatively be formed over the entire surface of the substrate. Specific examples of types of the coated cutting tool include an indexable cutting insert for milling or turning, a drill, an end mill, etc.

<Substrate>

In the present invention, a "substrate" can be made of, for example, a cemented carbide, cermet, ceramic, a sintered body of cubic boron nitride, a sintered body of diamond, high-speed steel, etc. In particular, a substrate may include at least any one of a cemented carbide, cermet, ceramic and a sintered body of cubic boron nitride. The substrate may also consist of any one of a cemented carbide, cermet, ceramic and a sintered body of cubic boron nitride. A substrate consisting of any one of a cemented carbide, cermet, ceramic and a sintered body of cubic boron nitride is preferred with respect to the point of having excellent wear resistance and fracture resistance.

The surfaces of such substrates may be modified. For instance, in the case of a substrate made of a cemented carbide, a β-free layer may be formed on a surface thereof, and in the case of a substrate made of cermet, a surface hardened layer may be formed thereon. Even if a substrate surface has been modified in this way, the effect of the present invention is still provided.

<Coating Layer>

In the present invention, a "coating layer" preferably has an average thickness of from 3 μm or more to 30 μm or less. If the coating layer has a thickness of less than 3 μm, this may lead to inferior wear resistance. If the coating layer has a thickness of over 30 μm, this may lead to degraded adhesion between the coating layer and the substrate or degraded fracture resistance of the coated cutting tool. The coating layer preferably has, in particular, a thickness of from 3 μm or more to 20 μm or less. The coating layer may consist of a single layer but preferably consists of multiple layers.

<α-Type Aluminum Oxide Layer>

A coating layer according to the present invention includes at least one aluminum oxide layer. The crystal type of such aluminum oxide layer may be α type (i.e., trigonal crystal). Here, as to a polished surface of the α-type aluminum oxide layer substantially parallel to the substrate surface, an angle formed by the normal of the polished surface and the normal of a (222) plane of a particle of the α-type aluminum oxide layer is regarded as a misorientation. Further, in the polished surface, the areas of particles, each of which has a misorientation ranging from 0 degrees or more to 90 degrees or less, of the α-type aluminum oxide layer is regarded as 100 area %. Here, such areas of particles, each of which has a misorientation ranging from 0 degrees or more to 90 degrees or less, of the α-type aluminum oxide layer are divided into respective 10-degree pitches. For instance, when a particle has a misorientation of from 20 degrees or more to below 30 degrees, the area of such particle in the polished surface is treated as an area which involves the range of misorientation of from 20 degrees or more to below 30 degrees. As a result, as to the α-type aluminum oxide layer in the coating layer, the total Sa of the areas of particles each of which has a misorientation ranging from 20 degrees or more to below 30 degrees is at a maximum from among the totals of areas for nine divisions. As can be seen from the above, the α-type aluminum oxide layer is formed such that particles each of which has a misorientation of from 20 degrees or more to below 30 degrees are dominant, whereby fracture resistance (including chipping resistance) of a coated cutting tool is not degraded while wear resistance can be enhanced. The (222) plane of an α-type aluminum oxide particle (i.e., a crystal grain) is a slip plane, and this indicates that the slip plane is a surface that becomes more parallel to the substrate as the misorientation approaches 0 degrees. Accordingly, when the ratio of particles each of which has a misorientation ranging from 0 degrees or more to below 10 degrees increases, it can be considered that excellent chipping resistance and fracture resistance are achieved while resistance against abrasive wear (i.e., wear resistance) is degraded. Meanwhile, when particles each of which has a misorientation ranging from 20 degrees or more to below 30 degrees are dominant in the α-type aluminum oxide layer, resistance against abrasive wear can be enhanced while keeping chipping resistance and fracture resistance. The (222) plane of α-type aluminum oxide is represented based on rhombohedral axes. When the way of placing axes representing crystal planes and such crystal planes are represented based on hexagonal axes, the (222) plane can be indicated as a (006) plane.

In an α-type aluminum oxide layer according to the present invention, assuming that a total of the areas of particles, each of which has a misorientation ranging from 20 degrees or more to below 30 degrees, is Sa, 25 area %≤Sa≤70 area % is preferred. This is preferred in that wear resistance can be suitably enhanced without degrading fracture resistance. When the total Sa of the areas of particles, each of which has a misorientation ranging from 20 degrees or more to below 30 degrees, constitutes less than 25 area %, particles each of which has a misorientation ranging from 0 degrees or more to below 10 degrees or particles each of which has a misorientation ranging from 30 degrees or more are highly dominant in the α-type aluminum oxide layer, resulting in wear resistance or fracture resistance tending to be degraded. On the other hand, it is substantially difficult to increase the total Sa of the areas of particles, each of which has a misorientation ranging from 20 degrees or more to below 30 degrees, so as to constitute over 70 area %.

In an α-type aluminum oxide layer according to the present invention, assuming that a total of the areas of particles, each of which has a misorientation ranging from 0 degrees or more to below 10 degrees, in the polished surface, is Sb, 10 area %≤Sb≤20 area % is preferred. When the total Sb of the areas of particles, each of which has a misorientation ranging from 0 degrees or more to below 10 degrees, constitutes less than 10 area %, coating cracking or peeling off will be increased, which may invite degraded chipping resistance or fracture resistance. When the total Sb of the areas of particles, each of which has a misorientation ranging from 0 degrees or more to below 10 degrees, constitutes over 20 area %, which may lead to degraded resistance against abrasive wear, namely, wear resistance.

An α-type aluminum oxide layer according to the present invention preferably has an average thickness of from 1 μm or more to 15 μm or less. If the α-type aluminum oxide layer has an average thickness of less than 1 μm, crater wear resistance may be degraded in the flank, and if the α-type aluminum oxide layer has an average thickness of over 15 μm, peeling off will easily occur, which may lead to degraded fracture resistance.

A polished surface of an α-type aluminum oxide layer refers to a surface of an α-type aluminum oxide layer obtained by polishing a coated cutting tool, in a direction substantially parallel (preferably, parallel) to the substrate surface until such α-type aluminum oxide layer appears. At this time, such polished surface is preferably obtained in a position where, in the direction of the thickness of the coating layer, 50% or higher of the average thickness of the α-type aluminum oxide layer is left. More preferably, such polished surface may be obtained in a position where, in the direction of the thickness of the coating layer, from 50% or higher to 90% or lower of the α-type aluminum oxide layer is left. In particular, the polished surface may be a mirror finished surface. Examples of a method of obtaining a mirror polished surface of an α-type aluminum oxide layer can include a polishing method with the use of diamond paste or colloidal silica and ion milling. However, the present invention encompasses a coated cutting tool having the above-described feature not only in a polished surface but also in a cross-sectional surface, which is formed by various methods, of an α-type aluminum oxide layer.

Regarding the area as to the orientation of each particle, a cross-sectional surface of the α-type aluminum oxide layer, preferably a polished surface thereof, is prepared, and such area can then be measured using an electron backscatter diffraction pattern apparatus (EBSD) attached to a scanning electron microscope (SEM), a field emission scanning electron microscope (FE-SEM), etc. An EBSD is used to determine the crystal orientation of each particle (i.e., a crystal) of the α-type aluminum oxide layer, and the area of the particle, in the polished surface, whose crystal orientation has been determined, is treated, depending on the misorientation, as an area for any of nine divisions in respective 10-degree pitches which cover the range of misorientation of from 0 degrees or more to 90 degrees or less, whereby the area ratio can be obtained regarding each of such misorientation divisions.

More specifically, such area ratio can be obtained by the following method. A sample having a polished surface of an α-type aluminum oxide layer is set on an FE-SEM, and the sample is then irradiated with an electron beam at an angle of incidence of 70 degrees as well as at an acceleration voltage of 15 kV and an irradiation current of 0.5 nA.

Measurement is desirably performed under the EBSD settings of a measurement range of 30 μm×50 μm and a step size of 0.1 μm.

<Ti Compound Layer>

In addition to the above α-type aluminum oxide layer, a coating layer according to the present invention may include at least one Ti compound layer. The Ti compound layer is preferably provided so as to achieve enhanced wear resistance. The Ti compound layer may be formed, as a lower layer, between the substrate and the α-type aluminum oxide layer, and alternatively or additionally, the Ti compound layer may be formed, as an upper layer, outside of the α-type aluminum oxide layer. In particular, the Ti compound layer is preferably formed on the substrate surface because the adhesion between the substrate and the coating layer is enhanced. Further, the Ti compound layer is preferably formed on the outermost layer of the coating layer because it becomes easy to identify a spent corner (i.e., a spent cutting edge) of the cutting tool. For instance, TiN represents yellowish color, and, while it is being used, a change occurs at least in the gloss. The Ti compound layer refers to a compound layer including a Ti element, as an essential component thereof, and at least one element selected from the group consisting of C, N, O and B. For instance, the Ti compound layer may consist of at least one element out of TiC, TiN, TiCN, TiCO, TiCNO and TiB$_2$. The Ti compound layer may also include at least one element, as (an) optional element(s), selected from the group consisting of Zr, Hf, V, Nb, Ta, Cr, Mo, W, Al and Si.

The average thickness of a Ti compound layer according to the present invention is preferably from 2 μm or more to 15 μm or less. This is because, when the average thickness of the Ti compound layer is less than 2 μm, the wear resistance tends to be decreased, and on the other hand, because, when the average thickness of the Ti compound layer is over 15 μm, the fracture resistance tends to be decreased. It should be noted that, when the Ti compound layer is formed so as to serve as each of the lower layer and the upper layer, the average thickness of the Ti compound layer refers to the total of the average thicknesses of the lower layer and the upper layer. Further, for instance, when multiple Ti compound layers are formed so as to serve as the lower layer, the total of the thicknesses of such multiple layers can be included in the thickness of the Ti compound layer.

[Method of Forming a Coating Layer]

Examples of a method of forming layers that constitute a coating layer in a coated cutting tool according to the present invention include the method set forth below.

For instance, a TiN layer can be formed by chemical vapor deposition with a raw material gas composition of TiCl$_4$: from 5.0 mol % or more to 10.0 mol % or less, N$_2$: from 20 mol % or more to 60 mol % or less and H$_2$: the balance, a temperature of from 850° C. or higher to 920° C. or lower, and a pressure of from 100 hPa or higher to 350 hPa or lower.

A TiCN layer can be formed by chemical vapor deposition with a raw material gas composition of TiCl$_4$: from 10 mol % or more to 15 mol % or less, CH$_3$CN: from 1 mol % or more to 3 mol % or less, N$_2$: 0 mol % or more to 20 mol % or less and H$_2$: the balance, a temperature of from 850° C. or higher to 920° C. or lower, and a pressure of from 60 hPa or more to 80 hPa or less.

A TiC layer can be formed by chemical vapor deposition with a raw material gas composition of TiCl$_4$: from 1.0 mol % or more to 3.0 mol % or less, CH$_4$: 4.0 mol % or more to 6.0 mol % or less and $H_2$: the balance, a temperature of from 990° C. or higher to 1,030° C. or lower, and a pressure of from 50 hPa or higher to 100 hPa or lower.

A TiAlCNO layer can be formed by chemical vapor deposition with a raw material gas composition of $TiCl_4$: from 3.0 mol % or more to 5.0 mol % or less, $AlCl_3$: from 1.0 mol % or more to 2.0 mol % or less; CO: from 0.4 mol % or more to 1.0 mol % or less, $N_2$: from 30 mol % or more to 40 mol % or less and $H_2$: the balance, a temperature of from 975° C. or higher to 1,025° C. or lower, and a pressure of from 90 hPa or higher to 110 hPa or lower.

A TiAlCO layer can be formed by chemical vapor deposition with a raw material gas composition of $TiCl_4$: from 0.5 mol % or more to 1.5 mol % or less, $AlCl_3$: from 3.0 mol % or more to 5.0 mol % or less; CO: from 2.0 mol % or more to 4.0 mol % or less and $H_2$: the balance, a temperature of from 975° C. or higher to 1,025° C. or lower, and a pressure of from 60 hPa or higher to 100 hPa or lower.

A TiCNO layer can be formed by chemical vapor deposition with a raw material gas composition of $TiCl_4$: from 3.0 mol % or more to 5.0 mol % or less, CO: from 0.4 mol % or more to 1.0 mol % or less, $N_2$: from 30 mol % or more to 40 mol % or less and $H_2$: the balance, a temperature of from 975° C. or higher to 1,025° C. or lower, and a pressure of from 90 hPa or higher to 110 hPa or lower.

A TiCO layer can be formed by chemical vapor deposition with a raw material gas composition of $TiCl_4$: from 0.5 mol % or more to 1.5 mol % or less, CO: from 2.0 mol % or more to 4.0 mol % or less and $H_2$: the balance, a temperature of from 975° C. or higher to 1,025° C. or lower, and a pressure of from 60 hPa or higher to 100 hPa or lower.

A coated cutting tool according to the present invention which involves the controlled distribution of areas of particles of an α-type aluminum oxide layer based on the misorientation divisions can be obtained by, for example, the method set forth below.

A method for obtaining a coating layer of a coated cutting tool in the present invention includes roughly three steps. Firstly, a Ti compound layer consisting of a single layer or multiple layers is formed, as a lower layer, on a substrate surface of a coated cutting tool by, for example, the above-described method (first step). Next, two kinds of nuclei of aluminum oxide are formed on a surface of the Ti compound layer (second step). Then, an α-type aluminum oxide layer is formed in the state in which such nuclei have been formed (third step). Further, a Ti compound layer may be formed as an outermost layer (fourth step).

The two kinds of nuclei of aluminum oxide are a nucleus formed at a relatively high temperature (hereinafter referred to as the first nucleus) and a nucleus formed at a temperature lower than that for the first nucleus (hereinafter referred to as the second nucleus). Although the first nucleus, being one of the two kinds of nuclei of aluminum oxide, will be described below in detail, the first nucleus can be formed with a small amount of $C_3H_6$ gas caused to flow at a high temperature (first predetermined temperature). When an α-type aluminum oxide layer is formed in the state in which the first nucleus has been formed, then, particles each of which has a misorientation ranging from 80 degrees or more to 90 degrees or less can be obtained. The second nucleus, being the other type of nucleus of aluminum oxide, can be formed with a small amount of $CH_4$ gas caused to flow at a low temperature (second predetermined temperature). When an α-type aluminum oxide layer is formed in the state in which the second nucleus has been formed, then, particles each of which has a misorientation ranging from 0 degrees or more to below 10 degrees can be obtained. It should be noted that the second predetermined temperature is lower than the first predetermined temperature.

In particular, on the surface of the Ti compound layer, the above-described two kinds of nuclei of aluminum oxide are formed so as to be mixed each other, and an α-type aluminum layer is formed at a formation rate slower than that involved under conventionally-known conditions, whereby the total Sa of the areas of particles, each of which has a misorientation ranging from 20 degrees or more to below 30 degrees, can be at a maximum among the nine ranges. It should be noted that the rate of formation of an α-type aluminum oxide layer under the conventionally-known conditions is from 0.8 μm/h or higher to 1.2 μm/h or lower, and the intended rate of formation under the conventionally-known conditions is 0.4 μm/h or higher to 0.7 μm/h or lower. More specifically, α-type aluminum oxide particles of the present invention can be obtained by the steps set forth below. It should be noted that steps (A) and (B) below are included in the above-described second step, and step (C) below corresponds to the above-described third step.

In step (A), the first nucleus of aluminum oxide (hereinafter referred to as $Al_2O_3$) is formed. Such first nucleus of $Al_2O_3$ is formed by chemical vapor deposition with a raw material gas composition of: $AlCl_3$: from 2.1 mol % or more to 5.0 mol % or less, $CO_2$: from 2.5 mol % or more to 4.0 mol % or less, HCl: from 2.0 mol % or more to 3.0 mol % or less, $H_2S$: from 0.28 mol % or more to 0.45 mol % or less, $C_3H_6$: from 0.05 mol % or more to 0.2 mol % or less and $H_2$: the balance, a temperature of from 920° C. or higher to 950° C. or lower, and a pressure of from 60 hPa or higher to 80 hPa or lower.

In step (B), the second nucleus of $Al_2O_3$, which is different from the first nucleus already formed in step (A), is formed. Such second nucleus of $Al_2O_3$ is formed by chemical vapor deposition with a raw material gas composition of: $AlCl_3$: from 2.1 mol % or more to 5.0 mol % or less, $CO_2$: from 2.5 mol % or more to 4.0 mol % or less, CO: from 0.5 mol % or more to 1.0 mol % or less, HCl: from 2.0 mol % or more to 3.0 mol % or less, $H_2S$: from 0.28 mol % or more to 0.45 mol % or less, $CH_4$: from 0.05 mol % or more to 0.2 mol % or less and $H_2$: the balance, a temperature of from 850° C. or higher to 900° C. or lower, and a pressure of from 60 hPa or higher to 80 hPa or lower. If the temperature at which the second nucleus of $Al_2O_3$ is 890° C. or higher, the total Sb of the areas of particles, each of which has a misorientation ranging from 0 degrees or more to below 10 degrees may constitute less than 10 area %, the temperature under the conditions of forming the second nucleus preferably ranges from 850° C. or higher to 880° C. or lower. Through step (B), the first nucleus and the second nucleus are formed on the Ti compound layer while being in a mixed state.

In step (C), an α-type aluminum oxide layer (hereinafter referred to as the α-type $Al_2O_3$ layer) is formed. This step includes growing the first nucleus and the second nucleus obtained by step (A) and step (B). Such α-type $Al_2O_3$ layer can be formed by chemical vapor deposition with a raw material gas composition of: $AlCl_3$: from 2.1 mol % or more to 2.5 mol % or less, $CO_2$: from 2.5 mol % or more to 4.0 mol % or less, HCl: from 2.0 mol % or more to 3.0 mol % or less, $H_2S$: from 0.15 mol % or more to 0.25 mol % or less and $H_2$: the balance, a temperature of from 850° C. or higher to 920° C. or lower, and a pressure of from 30 hPa or higher to 50 hPa or lower.

It should be noted that, if the $AlCl_3$ in steps (A) and (B), each in which a nuclei of $Al_2O_3$ is formed, is at 2.2 mol % or lower, the total Sa of the areas of particles, each of which has a misorientation ranging from 20 degrees or more to below 30 degrees, of the α-type $Al_2O_3$ layer is inclined to constitute less than 25 area %. Therefore, the concentration of $AlCl_3$ preferably ranges from 2.7 mol % or more to 5.0 mol % or less so as to provide sufficient leeway.

The thickness of each layer can be measured from a cross-sectional structure of the coated cutting tool, using an optical microscope, a scanning electron microscope (SEM), a field emission scanning electron microscope (FE-SEM), etc. It should be noted that, as to the thickness of the coated cutting tool, the thickness of each layer is measured, at three or more locations, at the position approximately 50 μm off from the edge (i.e., the cutting edge) toward the rake surface or the flank of the coated cutting tool, and the average value of the resultant measurements may be obtained. More specifically, the thickness may be measured in a region at a distance of approximately 50 μm from the rake-surface-side boundary of the cutting edge toward the rake surface of the coated cutting tool, and alternatively, the thickness may be measured in a region at a distance of approximately 50 μm from the flank-side boundary of the cutting edge toward the flank of the coated cutting tool.

The composition of each layer can be measured from a cross-sectional structure of a coated cutting tool of the present invention, using an energy-dispersive X-ray spectroscope (EDS), a wavelength-dispersive X-ray spectroscope (WDS), etc. Further, the α-type aluminum oxide layer may in particular have the above configuration concerning the (222) plane in a predetermined region located approximately 50 μm off the edge (cutting edge) toward the rake surface or the flank of the coated cutting tool. The predetermined region can be defined in any position and/or in any range and may also be defined in the rake surface or the flank. The predetermined region may have, for example, a range of 100 μm×100 μm, and preferably 30 μm×50 μm. In particular, the above configuration concerning the (222) plane may be included in a predetermined region which is substantially parallel to the substrate surface and which extends in a position where at least 50% of the α-type aluminum oxide layer is left. More specifically, this predetermined region may be defined in a cross-sectional surface formed in a region A of FIG. 1 described below, preferably a polished surface.

EXAMPLES

Although the present invention will now be described below with examples, the present invention is not limited to such examples.

As to the thickness of each layer of a sample, the cross section of a part near the position approximately 50 μm off from the edge of a coated cutting tool (e.g., a cutting insert) toward the rake surface was measured at three locations using an FE-SEM, and the average of the resultant measurements was obtained. Further explanation will now be made with reference to FIG. 1. FIG. 1 is a schematic cross-sectional view showing a part near an edge of a coated cutting tool. In FIG. 1, reference symbol "2" denotes an edge, namely, a cutting edge, reference symbol "4" denotes a rake surface, reference symbol "6" denotes a flank, reference symbol "10" denotes a substrate, and reference symbol "12" denotes a coating layer. The cutting edge 2 has a substantially arc-shaped cross-sectional surface. In the region A, which is approximately 50 μm off the rake-surface 4 side boundary of the cutting edge 2 (see the broken line in FIG. 1) in the direction of the rake surface 4, the cross section which extends in the thickness direction of the coating layer (i.e., the direction perpendicular to a surface of the substrate 10) was obtained, and the thickness of each layer of the sample was measured.

Areas of the particles of the α-type $Al_2O_3$ layer of an obtained sample as to the misorientation divisions were measured using an EBSD attached to an FE-SEM.

A cemented carbide cutting insert with a shape of JIS certified CNMA120408 and a composition of 93.1WC-6.5Co-0.4$Cr_3C_2$ (mass %) was prepared as a substrate. The ridgeline portion of the cutting edge of such substrate was subjected to round honing by means of a SiC brush, and the substrate surface was then washed.

After the washing of the substrate surface, as to invention samples 1 to 10, the substrate was inserted into an external heating chemical vapor deposition apparatus, and firstly, a lower layer (Ti compound layer), which consists of the three layers indicated in Table 5, was formed in the order of the first to third layers, as indicated in Tables 4 and 5. After the formation of the lower layer, two kinds of nuclei of $Al_2O_3$ were formed under the conditions shown in Table 1, and an α-type $Al_2O_3$ layer was formed on the substrate surface so as to achieve the configuration of the coating layer and the average thicknesses in Table 5, under the conditions shown in Tables 2 and 4. Thereafter, as to invention samples 1 to 8, an upper layer of TiN was formed, as shown in Tables 4 and 5. Therefore, as shown in FIG. 2, with regard to invention samples 1 to 8, the coating layer 12 was provided on the substrate 10, the coating layer 12 includes a lower layer 14, which includes a first layer 14a, a second layer 14b and a third layer 14c in order from the substrate side, and an α-type $Al_2O_3$ layer 16 and an upper layer 18 were provided, in order, on the third layer 14c. With regard to invention samples 9 and 10, the upper layer 18 was not formed, differently from the coating layer in invention samples 1 to 8. Therefore, in the initial state, the upper layer 18 serves as the outermost layer in invention samples 1 to 8, and the $Al_2O_3$ layer 16 serves as the outermost layer in invention samples 9 and 10. It should be noted that FIG. 2 is a sectional schematic view of a part (corresponding to, for example, the region A in FIG. 1) of an invention sample. A polished surface of the α-type $Al_2O_3$ layer 16 is, for instance, formed along a line L substantially parallel to a surface 10a of the substrate 10.

After the washing of the substrate surface, as to comparative samples 1 to 10, the substrate was inserted into an external heating chemical vapor deposition apparatus, and firstly, a lower layer (Ti compound layer), which consists of the three layers indicated in Table 5, was formed in the order of the first to third layers, as indicated in Tables 4 and 5. After the formation of the lower layer, a nucleus of $Al_2O_3$ was formed under the conditions shown in Table 3, and an α-type $Al_2O_3$ layer was formed on the substrate surface so as to achieve the configuration of the coating layer and the average thicknesses in Table 5, under the conditions shown in Table 4. Thereafter, as to comparative samples 1 to 8, an upper layer of TiN was formed, as shown in Tables 4 and 5.

TABLE 1

| Sample No. | Temperature (° C.) | Pressure (hPa) | Material Composition (mol %) |
|---|---|---|---|
| Step A | | | |
| Invention Example 1 | 920 | 70 | $AlCl_3$: 2.2%, $CO_2$: 3.3%, HCl: 2.5%, $H_2S$: 0.3%, $C_3H_6$: 0.1%, $H_2$: 91.6% |
| Invention Example 2 | 920 | 60 | $AlCl_3$: 2.7%, $CO_2$: 3.3%, HCl: 2.5%, $H_2S$: 0.3%, $C_3H_6$: 0.1%, $H_2$: 91.1% |
| Invention Example 3 | 940 | 70 | $AlCl_3$: 2.7%, $CO_2$: 3.3%, HCl: 2.5%, $H_2S$: 0.3%, $C_3H_6$: 0.1%, $H_2$: 91.1% |
| Invention Example 4 | 940 | 70 | $AlCl_3$: 2.7%, $CO_2$: 3.3%, HCl: 2.5%, $H_2S$: 0.3%, $C_3H_6$: 0.1%, $H_2$: 91.1% |
| Invention Example 5 | 950 | 70 | $AlCl_3$: 2.7%, $CO_2$: 3.3%, HCl: 2.5%, $H_2S$: 0.3%, $C_3H_6$: 0.1%, $H_2$: 91.1% |
| Invention Example 6 | 950 | 70 | $AlCl_3$: 2.7%, $CO_2$: 3.3%, HCl: 2.5%, $H_2S$: 0.3%, $C_3H_6$: 0.1%, $H_2$: 91.1% |
| Invention Example 7 | 940 | 70 | $AlCl_3$: 2.2%, $CO_2$: 3.8%, HCl: 2.5%, $H_2S$: 0.3%, $C_3H_6$: 0.1%, $H_2$: 91.1% |
| Invention Example 8 | 940 | 70 | $AlCl_3$: 4.7%, $CO_2$: 3.3%, HCl: 2.5%, $H_2S$: 0.3%, $C_3H_6$: 0.2%, $H_2$: 89.0% |
| Invention Example 9 | 940 | 70 | $AlCl_3$: 2.7%, $CO_2$: 2.8%, HCl: 2.5%, $H_2S$: 0.3%, $C_3H_6$: 0.1%, $H_2$: 91.6% |
| Invention Example 10 | 940 | 80 | $AlCl_3$: 2.7%, $CO_2$: 3.3%, HCl: 2.5%, $H_2S$: 0.3%, $C_3H_6$: 0.1%, $H_2$: 91.1% |
| Step B | | | |
| Invention Example 1 | 850 | 70 | $AlCl_3$: 2.2%, $CO_2$: 3.3%, CO: 0.7%, HCl: 2.5%, $H_2S$: 0.3%, $CH_4$: 0.1%, $H_2$: 90.9% |
| Invention Example 2 | 850 | 60 | $AlCl_3$: 2.7%, $CO_2$: 3.3%, CO: 0.7%, HCl: 2.5%, $H_2S$: 0.3%, $CH_4$: 0.1%, $H_2$: 90.4% |
| Invention Example 3 | 900 | 70 | $AlCl_3$: 2.7%, $CO_2$: 2.8%, CO: 0.7%, HCl: 2.4%, $H_2S$: 0.3%, $CH_4$: 0.2%, $H_2$: 90.9% |
| Invention Example 4 | 880 | 70 | $AlCl_3$: 2.7%, $CO_2$: 3.3%, CO: 0.7%, HCl: 2.5%, $H_2S$: 0.3%, $CH_4$: 0.1%, $H_2$: 90.4% |
| Invention Example 5 | 870 | 70 | $AlCl_3$: 2.7%, $CO_2$: 3.3%, CO: 0.7%, HCl: 2.5%, $H_2S$: 0.3%, $CH_4$: 0.1%, $H_2$: 90.4% |
| Invention Example 6 | 900 | 70 | $AlCl_3$: 2.7%, $CO_2$: 3.3%, CO: 0.7%, HCl: 2.5%, $H_2S$: 0.3%, $CH_4$: 0.1%, $H_2$: 90.4% |
| Invention Example 7 | 870 | 70 | $AlCl_3$: 2.7%, $CO_2$: 3.3%, CO: 0.7%, HCl: 2.5%, $H_2S$: 0.3%, $CH_4$: 0.1%, $H_2$: 90.4% |
| Invention Example 8 | 890 | 70 | $AlCl_3$: 4.7%, $CO_2$: 3.3%, CO: 0.7%, HCl: 2.5%, $H_2S$: 0.3%, $CH_4$: 0.1%, $H_2$: 88.4% |
| Invention Example 9 | 870 | 70 | $AlCl_3$: 2.7%, $CO_2$: 2.8%, CO: 0.7%, HCl: 2.4%, $H_2S$: 0.3%, $CH_4$: 0.2%, $H_2$: 90.9% |
| Invention Example 10 | 900 | 80 | $AlCl_3$: 2.7%, $CO_2$: 3.3%, CO: 0.7%, HCl: 2.5%, $H_2S$: 0.3%, $CH_4$: 0.1%, $H_2$: 90.4% |

TABLE 2

| Sample No. | Temperature (° C.) | Pressure (hPa) | Material Composition (mol %) |
|---|---|---|---|
| Step C | | | |
| Invention Example 1 | 850 | 50 | $AlCl_3$: 2.5%, $CO_2$: 3.3%, HCl: 2.5%, $H_2S$: 0.25%, $H_2$: 91.45% |
| Invention Example 2 | 900 | 50 | $AlCl_3$: 2.5%, $CO_2$: 3.3%, HCl: 2.5%, $H_2S$: 0.25%, $H_2$: 91.45% |
| Invention Example 3 | 920 | 30 | $AlCl_3$: 2.1%, $CO_2$: 3.3%, HCl: 2.5%, $H_2S$: 0.2%, $H_2$: 91.9% |
| Invention Example 4 | 920 | 50 | $AlCl_3$: 2.3%, $CO_2$: 3.3%, HCl: 2.5%, $H_2S$: 0.2%, $H_2$: 91.7% |
| Invention Example 5 | 920 | 50 | $AlCl_3$: 2.3%, $CO_2$: 3.3%, HCl: 2.5%, $H_2S$: 0.2%, $H_2$: 91.7% |
| Invention Example 6 | 920 | 50 | $AlCl_3$: 2.3%, $CO_2$: 3.3%, HCl: 2.5%, $H_2S$: 0.2%, $H_2$: 91.7% |
| Invention Example 7 | 920 | 50 | $AlCl_3$: 2.3%, $CO_2$: 3.3%, HCl: 2.5%, $H_2S$: 0.2%, $H_2$: 91.7% |
| Invention Example 8 | 920 | 50 | $AlCl_3$: 2.3%, $CO_2$: 3.3%, HCl: 2.5%, $H_2S$: 0.2%, $H_2$: 91.7% |
| Invention Example 9 | 920 | 50 | $AlCl_3$: 2.3%, $CO_2$: 3.3%, HCl: 2.5%, $H_2S$: 0.2%, $H_2$: 91.7% |
| Invention Example 10 | 920 | 50 | $AlCl_3$: 2.3%, $CO_2$: 3.3%, HCl: 2.5%, $H_2S$: 0.2%, $H_2$: 91.7% |

TABLE 3

| Sample No. | Temperature (° C.) | Pressure (hPa) | Material Composition (mol %) |
|---|---|---|---|
| Comparative Example 1 | 1000 | 70 | $AlCl_3$: 2.7%, $CO_2$: 3.3%, HCl: 2.5%, $H_2S$: 0.3%, $C_3H_6$: 0.1%, $H_2$: 91.1% |
| Comparative Example 2 | 1000 | 60 | $AlCl_3$: 2.7%, $CO_2$: 3.3%, HCl: 2.5%, $H_2S$: 0.3%, $C_3H_6$: 0.1%, $H_2$: 91.1% |
| Comparative Example 3 | 1000 | 70 | $AlCl_3$: 2.7%, $CO_2$: 3.3%, HCl: 2.5%, $H_2S$: 0.3%, $C_3H_6$: 0.1%, $H_2$: 91.1% |
| Comparative Example 4 | 1000 | 70 | $AlCl_3$: 2.7%, $CO_2$: 3.3%, HCl: 2.5%, $H_2S$: 0.3%, $C_3H_6$: 0.1%, $H_2$: 91.1% |
| Comparative Example 5 | 900 | 70 | $AlCl_3$: 2.7%, $CO_2$: 3.3%, CO: 0.7%, HCl: 2.5%, $H_2S$: 0.3%, $CH_4$: 0.1%, $H_2$: 90.4% |
| Comparative Example 6 | 900 | 70 | $AlCl_3$: 2.7%, $CO_2$: 3.3%, CO: 0.7%, HCl: 2.5%, $H_2S$: 0.3%, $CH_4$: 0.1%, $H_2$: 90.4% |
| Comparative Example 7 | 870 | 70 | $AlCl_3$: 2.7%, $CO_2$: 3.3%, CO: 0.7%, HCl: 2.5%, $H_2S$: 0.3%, $CH_4$: 0.1%, $H_2$: 90.4% |
| Comparative Example 8 | 870 | 70 | $AlCl_3$: 4.7%, $CO_2$: 3.3%, CO: 0.7%, HCl: 2.5%, $H_2S$: 0.3%, $CH_4$: 0.1%, $H_2$: 88.4% |
| Comparative Example 9 | 870 | 70 | $AlCl_3$: 2.7%, $CO_2$: 2.8%, CO: 0.7%, HCl: 2.4%, $H_2S$: 0.3%, $CH_4$: 0.2%, $H_2$: 90.9% |
| Comparative Example 10 | 870 | 80 | $AlCl_3$: 2.7%, $CO_2$: 3.3%, CO: 0.7%, HCl: 2.5%, $H_2S$: 0.3%, $CH_4$: 0.1%, $H_2$: 90.4% |

TABLE 4

| Coating Layer Type | Temperature (° C.) | Pressure (hPa) | Material Composition (mol %) |
|---|---|---|---|
| α-type $Al_2O_3$ | 1000 | 70 | $AlCl_3$: 2.7%, $CO_2$: 3.3%, HCl: 2.5%, $H_2S$: 0.3%, $H_2$: 91.2% |
| TiN | 900 | 400 | $TiCl_4$: 7.5%, $N_2$: 40%, $H_2$: 52.5% |
| TiC | 1000 | 75 | $TiCl_4$: 2.4%, $CH_4$: 4.6%, $H_2$: 93% |
| TiCN | 800 | 75 | $TiCl_4$: 3.0%, $CH_3CN$: 0.3%, $H_2$: 96.7% |
| TiCNO | 1000 | 100 | $TiCl_4$: 3.5%, CO: 0.7%, $N_2$: 35.5%, $H_2$: 60.3% |
| TiAlCNO | 1000 | 100 | $TiCl_4$: 3.8%, $AlCl_3$: 1.5%, CO: 0.7%, $N_2$: 35.2%, $H_2$: 58.8% |
| TiCO | 1000 | 80 | $TiCl_4$: 1.3%, CO: 2.7%, $H_2$: 96% |
| TiAlCO | 1000 | 80 | $TiCl_4$: 1.1%, $AlCl_3$: 3.9%, CO: 2.8%, $H_2$: 92.2% |

TABLE 5

| | Coating Layer Lower Layer Ti Compound Layer | | | | | |
|---|---|---|---|---|---|---|
| | First Layer | | Second Layer | | Third Layer | |
| Sample No. | Composition | Average Thickness (μm) | Composition | Average Thickness (μm) | Composition | Average Thickness (μm) |
| Invention Example 1 | TiN | 0.3 | TiCN | 7 | TiCNO | 1 |
| Invention Example 2 | TiN | 0.2 | TiCN | 2.5 | TiCNO | 0.3 |
| Invention Example 3 | TiN | 1 | TiCN | 18 | TiCNO | 1 |
| Invention Example 4 | TiN | 1 | TiCN | 5 | TiCNO | 1 |
| Invention Example 5 | TiN | 0.3 | TiCN | 10 | TiCNO | 1 |
| Invention Example 6 | TiN | 0.3 | TiCN | 13 | TiCNO | 1 |
| Invention | TiN | 0.3 | TiCN | 7 | TiAlCNO | 1 |

TABLE 5-continued

| Sample No. | | | | | | | |
|---|---|---|---|---|---|---|---|
| Invention Example 7 | TiN | 0.3 | TiCN | 7 | TiCNO | 1 | |
| Invention Example 8 | TiC | 0.3 | TiCN | 7 | TiCO | 1 | |
| Invention Example 9 | TiN | 0.3 | TiCN | 5 | TiAlCNO | 0.5 | |
| Invention Example 10 | TiN | 0.3 | TiCN | 7 | TiCNO | 1 | |
| Comparative Example 1 | TiN | 0.3 | TiCN | 7 | TiCNO | 1 | |
| Comparative Example 2 | TiN | 0.3 | TiCN | 7 | TiCNO | 1 | |
| Comparative Example 3 | TiN | 0.3 | TiCN | 5 | TiCNO | 1 | |
| Comparative Example 4 | TiN | 0.3 | TiCN | 7 | TiCNO | 1 | |
| Comparative Example 5 | TiN | 0.3 | TiCN | 7 | TiCNO | 1 | |
| Comparative Example 6 | TiN | 0.3 | TiCN | 7 | TiCNO | 1 | |
| Comparative Example 7 | TiC | 0.2 | TiCN | 1 | TiCNO | 0.3 | |
| Comparative Example 8 | TiN | 0.3 | TiCN | 20 | TiCNO | 0.7 | |
| Comparative Example 9 | TiN | 0.2 | TiCN | 7 | TiCNO | 0.3 | |
| Comparative Example 10 | TiN | 0.3 | TiCN | 10 | TiCNO | 0.3 | |

| | Coating Layer | | | | |
|---|---|---|---|---|---|
| | α-type Al$_2$O$_3$ | | Upper Layer | | |
| Sample No. | Average Thickness (μm) | Formation Rate (μm/h) | Composition | Average Thickness (μm) | Total Thickness (μm) |
| Invention Example 1 | 1.5 | 0.4 | TiN | 0.3 | 10.1 |
| Invention Example 2 | 2.5 | 0.6 | TiN | 0.7 | 6.2 |
| Invention Example 3 | 10 | 0.5 | TiN | 0.2 | 30.2 |
| Invention Example 4 | 5 | 0.7 | TiN | 0.2 | 12.2 |
| Invention Example 5 | 5 | 0.7 | TiN | 0.3 | 16.6 |
| Invention Example 6 | 5 | 0.7 | TiN | 0.3 | 19.6 |
| Invention Example 7 | 5 | 0.7 | TiN | 0.3 | 13.6 |
| Invention Example 8 | 10 | 0.7 | TiN | 0.2 | 18.5 |
| Invention Example 9 | 10 | 0.7 | — | — | 18.3 |
| Invention Example 10 | 15 | 0.7 | — | — | 20.8 |
| Comparative Example 1 | 5 | 1.1 | TiN | 0.3 | 13.6 |
| Comparative Example 2 | 5 | 1.1 | TiN | 0.2 | 13.5 |
| Comparative Example 3 | 1 | 1.1 | TiN | 0.3 | 9.6 |
| Comparative Example 4 | 10 | 1.1 | TiN | 0.3 | 16.6 |
| Comparative Example 5 | 1 | 1.1 | TiN | 0.3 | 9.6 |
| Comparative Example 6 | 5 | 1.1 | TiN | 0.2 | 13.5 |
| Comparative Example 7 | 5 | 1.1 | TiN | 0.3 | 6.8 |

TABLE 5-continued

| | | | | | |
|---|---|---|---|---|---|
| Example 7 | | | | | |
| Comparative Example 8 | 5 | 1.1 | TiN | 0.3 | 26.3 |
| Comparative Example 9 | 10 | 1.1 | — | — | 17.5 |
| Comparative Example 10 | 15 | 1.1 | — | — | 25.6 |

The polished surface of the α-type Al$_2$O$_3$ layer of an obtained coated cutting tool was observed with an FE-SEM, and the totals of the areas of particles as to the misorientation divisions were measured using an EBSD attached to the FE-SEM. The measurement results are shown in Table 6.

Measurement was performed by: setting a sample provided with a polished surface of an α-type Al$_2$O$_3$ layer on an FE-SEM, irradiating the sample with an electron beam at an incident angle of 70 degrees as well as at an acceleration voltage of 15 kV and an irradiation current of 0.5 nA; and employing the EBSD settings of a measurement range of 30 μm×50 μm and a step size of 0.1 μm. The areas of particles of the α-type Al$_2$O$_3$ layer in the measurement range were assumed to serve as a total sum of pixels corresponding to such areas. In the case of a step size of 0.01 μm, the area per pixel should be 0.0065 μm$^2$. That is, the areas of the particles of the α-type Al$_2$O$_3$ layer as to the misorientations were obtained by totaling the pixels as to the misorientations and converting the resultant total into areas.

TABLE 6

| | Total Area of Particles of α-type Al$_2$O$_3$ Layer as to Misorientations (area %) | | | | |
|---|---|---|---|---|---|
| Sample No. | 0° to below 10° | 10° to below 20° | 20° to below 30° | 30° to below 40° | 40° to below 50° |
| Invention Example 1 | 14 | 11 | 23 | 14 | 13 |
| Invention Example 2 | 11 | 17 | 26 | 15 | 12 |
| Invention Example 3 | 5 | 23 | 27 | 18 | 16 |
| Invention Example 4 | 11 | 11 | 32 | 17 | 8 |
| Invention Example 5 | 16 | 8 | 33 | 15 | 10 |
| Invention Example 6 | 5 | 20 | 30 | 15 | 9 |
| Invention Example 7 | 10 | 15 | 35 | 10 | 6 |
| Invention Example 8 | 5 | 10 | 54 | 11 | 6 |
| Invention Example 9 | 12 | 10 | 42 | 15 | 10 |
| Invention Example 10 | 3 | 7 | 67 | 8 | 5 |
| Comparative Example 1 | 8 | 6 | 8 | 11 | 7 |
| Comparative Example 2 | 7 | 3 | 6 | 10 | 7 |
| Comparative Example 3 | 2 | 2 | 5 | 9 | 8 |
| Comparative Example 4 | 1 | 3 | 1 | 4 | 9 |
| Comparative Example 5 | 30 | 25 | 18 | 7 | 2 |
| Comparative Example 6 | 35 | 12 | 14 | 6 | 5 |
| Comparative Example 7 | 38 | 15 | 11 | 2 | 1 |
| Comparative Example 8 | 40 | 22 | 6 | 6 | 3 |
| Comparative | 49 | 16 | 7 | 5 | 7 |

TABLE 6-continued

| | | | | | |
|---|---|---|---|---|---|
| Example 9 | | | | | |
| Comparative Example 10 | 52 | 10 | 6 | 7 | 3 |

| Sample No. | Total Area of Particles of α-type $Al_2O_3$ Layer as to Misorientations (area %) | | | | Misorientation Range which Involves Maximum Total Area of Particles of α-type $Al_2O_3$ Layer |
|---|---|---|---|---|---|
| | 50° to below 60° | 60° to below 70° | 70° to below 80° | 80° to 90° | |
| Invention Example 1 | 6 | 4 | 5 | 10 | 20° to below 30° |
| Invention Example 2 | 4 | 1 | 5 | 9 | 20° to below 30° |
| Invention Example 3 | 3 | 1 | 2 | 5 | 20° to below 30° |
| Invention Example 4 | 4 | 4 | 6 | 7 | 20° to below 30° |
| Invention Example 5 | 9 | 1 | 2 | 6 | 20° to below 30° |
| Invention Example 6 | 4 | 5 | 4 | 8 | 20° to below 30° |
| Invention Example 7 | 5 | 2 | 6 | 11 | 20° to below 30° |
| Invention Example 8 | 2 | 3 | 2 | 7 | 20° to below 30° |
| Invention Example 9 | 4 | 0 | 3 | 4 | 20° to below 30° |
| Invention Example 10 | 2 | 1 | 3 | 4 | 20° to below 30° |
| Comparative Example 1 | 14 | 15 | 15 | 16 | 80° to 90° |
| Comparative Example 2 | 13 | 18 | 16 | 20 | 80° to 90° |
| Comparative Example 3 | 8 | 16 | 21 | 29 | 80° to 90° |
| Comparative Example 4 | 12 | 17 | 26 | 27 | 80° to 90° |
| Comparative Example 5 | 1 | 5 | 4 | 8 | 0° to below 10° |
| Comparative Example 6 | 3 | 6 | 6 | 13 | 0° to below 10° |
| Comparative Example 7 | 3 | 8 | 7 | 15 | 0° to below 10° |
| Comparative Example 8 | 6 | 7 | 4 | 6 | 0° to below 10° |
| Comparative Example 9 | 3 | 2 | 5 | 6 | 0° to below 10° |
| Comparative Example 10 | 3 | 2 | 8 | 9 | 0° to below 10° |

Cutting tests 1 and 2 were conducted using obtained samples (i.e., cutting inserts). Cutting test 1 is a test for evaluating wear resistance, and cutting test 2 is a test for evaluating fracture resistance. The results of the cutting tests are shown in Table 7.

[Cutting Test 1]

Workpiece material: S45C round bar

Cutting rate: 300 m/min

Feed: 0.30 mm/rev

Depth of cut: 2.0 mm

Coolant: used

Evaluation items: A time when a sample was fractured or had a maximum flank wear width of 0.2 mm was defined as the end of the tool life, and the processing time to reach the end of the tool life was measured. It should be noted that "normal wear" in Table 7 refers to a situation in which the maximum flank wear width has reached 0.2 mm without any fracture. Further, "chipping" refers to a situation in which a "minute chip" of less than 0.2 mm has appeared.

[Cutting Test 2]

Workpiece material: S45C round bar with two equidistant grooves extending in the length direction Cutting rate: 250 m/min Feed: 0.40 mm/rev Depth of cut: 1.5 mm Coolant: used Evaluation items: A time when a sample was fractured was defined as the end of the tool life, and the number of shocks the sample had received until the end of the tool life was measured. The number of times the sample and the workpiece material were brought into contact with each other was defined as the number of shocks, and the test was ended when the number of contacts reached 20,000 at a maximum. It should be noted that, as to each sample, five cutting inserts were prepared and the number of shocks was measured for each of such cutting inserts, and the average was obtained from the measurements on the number of shocks so as to serve as the tool life.

TABLE 7

| Sample No. | Cutting Test 1 Wear Test | | Cutting Test 2 Fracture Test | |
|---|---|---|---|---|
| | Tool Life (min.) | Damaged Shape | Tool Life (times) | Damaged Shape |
| Invention Example 1 | 33 | Normal Wear | 20000 | Normal Wear |
| Invention Example 2 | 31 | Normal Wear | 18930 | Fracture |
| Invention Example 3 | 36 | Chipping | 15260 | Fracture |
| Invention Example 4 | 34 | Normal Wear | 17740 | Fracture |
| Invention Example 5 | 33 | Normal Wear | 19620 | Fracture |
| Invention Example 6 | 35 | Normal Wear | 16890 | Fracture |
| Invention Example 7 | 34 | Normal Wear | 17200 | Fracture |
| Invention Example 8 | 39 | Fracture | 16210 | Fracture |
| Invention Example 9 | 37 | Normal Wear | 20000 | Normal Wear |
| Invention Example 10 | 41 | Chipping | 16550 | Fracture |
| Comparative Example 1 | 24 | Chipping | 12130 | Fracture |
| Comparative Example 2 | 22 | Chipping | 12210 | Fracture |
| Comparative Example 3 | 15 | Fracture | 14900 | Fracture |
| Comparative Example 4 | 20 | Fracture | 8900 | Fracture |
| Comparative Example 5 | 27 | Normal Wear | 17540 | Fracture |
| Comparative Example 6 | 26 | Normal Wear | 17020 | Fracture |
| Comparative Example 7 | 23 | Normal Wear | 18040 | Fracture |
| Comparative Example 8 | 24 | Normal Wear | 18570 | Fracture |
| Comparative Example 9 | 22 | Normal Wear | 20000 | Normal Wear |
| Comparative Example 10 | 24 | Normal Wear | 20000 | Normal Wear |

As shown in Table 7, in each invention sample, the tool life in cutting test 1 was over 30 minutes, and the tool life in cutting test 2 was over 15,000 times. Thus, in the invention samples, wear resistance was enhanced without any reduction in fracture resistance (including chipping resistance). This indicates that, compared with the comparative samples, the invention samples each involve a longer processing time to reach the end of the tool life and a larger number of times of shocks the tool receives until the end of the tool life and therefore have a significantly longer tool life.

A coated cutting tool according to the present invention has excellent wear resistance without any reduction in fracture resistance and thus its tool life can be extended more than that involved in the prior art, and therefore, such coated cutting tool has high industrial availability.

The present invention is not limited to the above-described embodiments, modifications and examples. It should be appreciated that various alterations and changes can be made to the present invention without departing from the gist and scope of the invention defined in the claims. The present invention encompasses all kinds of modifications, applications and equivalents that are encompassed by the idea of the present invention defined by the scope of the claims.

The invention claimed is:

1. A coated cutting tool comprising: a substrate; and a coating layer formed on a surface of the substrate, wherein: the coating layer comprises at least one α-type aluminum oxide layer; and
in a cross-sectional surface of the α-type aluminum oxide layer which is substantially parallel to the surface of the substrate,
when an angle formed by a normal to the cross-sectional surface and a normal to a (222) plane of a particle of the α-type aluminum oxide layer is regarded as a misorientation, and
when areas of particles, each of which has a misorientation ranging from 0 degrees or more to 90 degrees or less, of the α-type aluminum oxide layer are defined as constituting 100 area %, and the areas of particles, each of which has a misorientation ranging from 0 degrees or more to 90 degrees or less, of the α-type aluminum oxide layer are divided into respective 10-degree pitches,
a total Sa of the areas of particles, each of which has a misorientation ranging from 20 degrees or more to below 30 degrees, of the α-type aluminum oxide layer, in the cross-sectional surface, is at a maximum from among totals of areas for nine divisions in respective 10-degree pitches.

2. The coated cutting tool according to claim 1, wherein the total Sa of the areas of particles, each of which has a misorientation ranging from 20 degrees or more to below 30 degrees, of the α-type aluminum oxide layer has a range of 25 area %≤Sa≤70 area %.

3. The coated cutting tool according to claim 1, wherein a total Sb of areas of particles, each of which has a misorientation ranging from 0 degrees or more to below 10 degrees, of the α-type aluminum oxide layer has a range of 10 area %≤Sb≤20 area %.

4. The coated cutting tool according to claim 1, wherein an average thickness of the α-type aluminum oxide layer is from 1 μm or more to 15 μm or less.

5. The coated cutting tool according to claim 1, wherein the coating layer comprises, between the substrate and the α-type aluminum oxide layer, a Ti compound layer containing a Ti compound of a Ti element and at least one element selected from the group consisting of C, N, O and B.

6. The coated cutting tool according to claim 5, wherein an average thickness of the coating layer is from 3 μm or more to 30 μm or less, and an average thickness of the Ti compound layer is from 2 μm or more to 15 μm or less.

7. The coated cutting tool according to claim 1, wherein the cross-sectional surface of the α-type aluminum oxide layer is defined with respect to a predetermined region of a rake surface or a flank of the coated cutting tool and is also defined in a position where at least 50% of the α-type aluminum oxide layer is left in a thickness direction of the coating layer.

8. The coated cutting tool according to claim 1, wherein the cross-sectional surface of the α-type aluminum oxide layer is a polished surface.

9. The coated cutting tool according to claim 1, wherein the substrate comprises any one of a cemented carbide, cermet, ceramics and sintered body of cubic boron nitride.

10. The coated cutting tool according to claim 1, the coated cutting tool being a cutting insert capable of being removably attached to a tool body.

11. The coated cutting tool according to claim 2, wherein a total Sb of areas of particles, each of which has a misorientation ranging from 0 degrees or more to below 10 degrees, of the α-type aluminum oxide layer has a range of 10 area %≤Sb≤20 area %.

12. The coated cutting tool according to claim 2, wherein an average thickness of the α-type aluminum oxide layer is from 1 μm or more to 15 μm or less.

13. The coated cutting tool according to claim 3, wherein an average thickness of the α-type aluminum oxide layer is from 1 μm or more to 15 μm or less.

14. The coated cutting tool according to claim 2, wherein the coating layer comprises, between the substrate and the α-type aluminum oxide layer, a Ti compound layer containing a Ti compound of a Ti element and at least one element selected from the group consisting of C, N, O and B.

15. The coated cutting tool according to claim 3, wherein the coating layer comprises, between the substrate and the α-type aluminum oxide layer, a Ti compound layer containing a Ti compound of a Ti element and at least one element selected from the group consisting of C, N, O and B.

16. The coated cutting tool according to claim 4, wherein the coating layer comprises, between the substrate and the α-type aluminum oxide layer, a Ti compound layer containing a Ti compound of a Ti element and at least one element selected from the group consisting of C, N, O and B.

17. The coated cutting tool according to claim 2, wherein the cross-sectional surface of the α-type aluminum oxide layer is defined with respect to a predetermined region of a rake surface or a flank of the coated cutting tool and is also defined in a position where at least 50% of the α-type aluminum oxide layer is left in a thickness direction of the coating layer.

18. The coated cutting tool according to claim 3, wherein the cross-sectional surface of the α-type aluminum oxide layer is defined with respect to a predetermined region of a rake surface or a flank of the coated cutting tool and is also defined in a position where at least 50% of the α-type aluminum oxide layer is left in a thickness direction of the coating layer.

19. The coated cutting tool according to claim 4, wherein the cross-sectional surface of the α-type aluminum oxide layer is defined with respect to a predetermined region of a rake surface or a flank of the coated cutting tool and is also defined in a position where at least 50% of the α-type aluminum oxide layer is left in a thickness direction of the coating layer.

20. The coated cutting tool according to claim 4, wherein the cross-sectional surface of the α-type aluminum oxide layer is defined with respect to a predetermined region of a rake surface or a flank of the coated cutting tool and is also defined in a position where at least 50% of the α-type aluminum oxide layer is left in a thickness direction of the coating layer.

* * * * *